(12) United States Patent
Sparks

(10) Patent No.: US 6,437,556 B1
(45) Date of Patent: Aug. 20, 2002

(54) ELECTRICAL CONTACT ASSEMBLY

(76) Inventor: Marthinus Johannes Sparks, 18 Korhaan Street, Middelburg 1050 (ZA)

( * ) Notice: Subject to any disclaimer, the term of this patent is extended or adjusted under 35 U.S.C. 154(b) by 0 days.

(21) Appl. No.: 09/555,157

(22) PCT Filed: Dec. 7, 1998

(86) PCT No.: PCT/US98/25905

§ 371 (c)(1),
(2), (4) Date: Jul. 17, 2000

(87) PCT Pub. No.: WO99/30175

PCT Pub. Date: Jun. 17, 1999

(30) Foreign Application Priority Data

Dec. 8, 1997 (ZA) ............................................ 97/11005

(51) Int. Cl.[7] ................................................. G01R 1/06
(52) U.S. Cl. ....................................................... 324/149
(58) Field of Search ................................ 324/754, 755, 324/765, 761, 149; 439/482, 391, 435, 436, 828, 829

(56) References Cited

U.S. PATENT DOCUMENTS

| | | | |
|---|---|---|---|
| 3,996,511 A | * 12/1976 | Baer | 324/51 |
| 4,151,462 A | 4/1979 | Teyler | 339/72.5 |
| 4,361,800 A | 11/1982 | Fodali et al. | 324/53 |
| 4,716,365 A | 12/1987 | Pool | 324/158 |
| 4,738,633 A | * 4/1988 | Fremgen et al. | 439/436 |
| 5,148,146 A | 9/1992 | Murphy | 340/461 |
| 5,424,630 A | 6/1995 | Vazquez | 324/72.5 |
| 5,782,553 A | 7/1998 | McDermott | 362/245 |
| 5,789,911 A | 8/1998 | Brass | 324/72.5 |

* cited by examiner

Primary Examiner—N. Le
Assistant Examiner—Etienne P LeRoux
(74) Attorney, Agent, or Firm—Ladas & Parry

(57) ABSTRACT

An electrical contact assembly (10) which includes a probe (12) and a housing (14) in which the probe (12) is selectively receivable at least in part. The probe (12) has an electrically conductive contact member (16) for selectively making contact with an electrical cable, contact or the like. The housing (14) includes a holding formation (15) defining a holding zone (62) in which an electrical cable (64) is receivable. The contact member (16) is displaceable into an operative position in which it is positioned in the holding zone (62) to make electrical contact with the cable (64).

12 Claims, 2 Drawing Sheets

ELECTRICAL CONTACT ASSEMBLY

BACKGROUND OF THE INVENTION

THIS INVENTION relates to an electrical contact assembly. It also relates to a housing and a probe for use in the assembly.

Testing apparatus such as continuity testers are well known. Such apparatus may be in the form of a probe having a contact which is selectively located at various points in an electrical circuit to monitor continuity.

SUMMARY OF THE INVENTION

In accordance with the invention, there is provided an electrical contact assembly, which includes a probe including an electrically conductive contact member; and a housing in which the probe is selectively at least partially receivable, the housing including a holding formation defining a holding zone in which an electrical cable is receivable and the contact member being displaceable into an operative position in which it is positioned in the holding zone to make electrical contact with the cable.

The housing may include an end portion which defines the holding formation. The end portion may be shaped and dimensioned to facilitate penetration of a wiring harness thereby to enable a user to locate the cable in the holding formation.

The end portion is typically tapered and defines a hook-like holding formation.

The holding formation may define a convex abutment surface which defines a terminal end of the holding zone and against which the cable abuts in use.

The housing may define at least one gripping formation shaped and dimensioned to facilitate gripping of the housing by a user. Typically, the assembly includes two concave gripping formations arranged in a syringe-like fashion. The gripping formations may protrude outwardly from an upper end of the housing.

The housing may include a locking member for locking the contact member in the operative position. Typically, the locking member is mounted pivotally to allow displacement into an operative position in which it frictionally engages the probe in such a fashion so as to retain the contact member in its operative position.

The probe may include a shaped body portion which is at least partially receivable within a complementary socket formation in the housing. The contact member may be mounted to a front end of the body portion and extend through the housing towards the holding zone.

The probe may include releasable mounting means for releasably mounting the contact member to the body portion. The contact member may be in the form of an elongate needle-like member. The releasable mounting means is typically in the form of an internal and external screw thread.

The body portion may include an outer component which is selectively received within the housing, and an inner component to which the contact member is mounted, and which is at least partially received within the outer component and displaceable relative to the outer component between a dormant position and an operative position in which the contact member is positioned in the holding zone.

The probe may include biassing means for biassing the inner component in its dormant position. The biassing means is typically in the form of a compression spring.

The inner component may define a hollow chamber arranged to receive electrical illumination means which has one terminal connectable to the contact member.

The inner component may be formed from at least a translucent material thereby to enable a user to monitor illumination of the electrical illumination means.

The housing may include reflection means for reflecting light emitted by the illumination means to facilitate detection thereof by a user.

The inner component may include a releasable closure member for retaining the illumination means within the hollow chamber.

The assembly may include a flexible lead. connected to another terminal of the illumination means and including a releasable electrical clip for selective connection to an earth line.

Further in accordance with the invention, there is provided a housing for use in an electrical contact assembly as hereinbefore described, the housing being arranged selectively and removably at least partially to receive a probe and the housing including an end portion which defines a holding formation, the end portion being shaped and dimensioned to facilitate penetration of a wiring harness thereby to enable a user to locate a cable in the holding formation.

The end portion is typically tapered and defines a hook-like holding formation.

The holding formation may define a convex abutment surface which defines a terminal end of a holding zone in which the cable is receivable and against which surface the cable abuts in use.

The housing may define at least one gripping formation shaped and dimensioned to facilitate gripping of the housing by a user. Typically, the housing defines two concave gripping formations arranged in a syringe-like fashion.

The housing may include a locking member for locking a contact member of the probe in an operative position in which it makes electrical contact with the cable.

The housing may include reflection means for reflecting light emitted by illumination means to facilitate detection thereof by a user.

Further in accordance with the invention, there is provided a probe for use in an electrical contact assembly as hereinbefore described, the probe including a body portion which is at least partially receivable within a housing, and a contact member mounted to a front end of the body portion and extending through the housing towards a holding zone defined by the housing for holding an electrical cable.

The probe may include releasable mounting means for releasably mounting the contact member to the body portion. The contact member may be in the form of an elongate needle-like member. Typically, the releasable mounting means is in the form of an internal and external screw thread.

The body portion may include an outer component which is selectively received within the housing and an inner component to which the contact member is mounted, and which is at least partially received within the outer component and displaceable relative to the outer component between a dormant position and an operative position in which the contact member makes electrical contact with an electrical cable in use.

The probe may include biassing means for biassing the inner component in its dormant position. The biassing means is typically in the form of a compression spring.

The inner component may define a hollow chamber arranged to receive electrical illumination means which has one terminal connectable to the contact member.

The inner component is typically formed from a translucent material thereby to enable a user to monitor illumination of the electrical illumination means in use. In other embodiments, the inner component is formed from a generally transparent plastics material.

The inner component may include a releasable closure member for retaining the illumination means within the hollow chamber.

The probe may include a flexible lead connected to the illumination means in use and a releasable electrical clip for selective connection to an earth line.

The invention will now be described, by way of example, with reference to the accompanying diagrammatic drawings.

DETAILED DESCRIPTION

Figure 1:
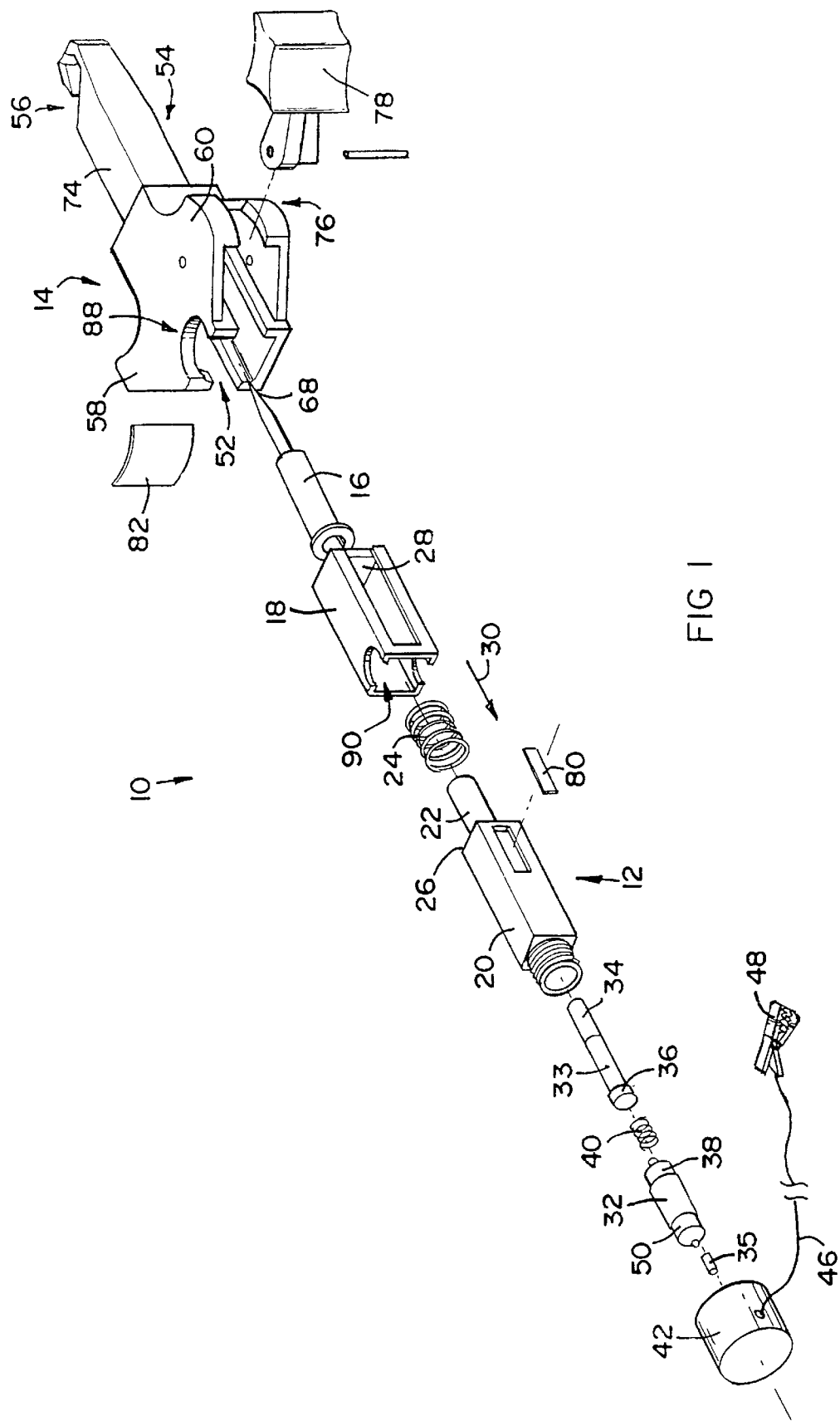
FIG. 1 shows an exploded view of an electrical contact assembly in accordance with the invention.

Referring to the drawings, reference numeral 10 generally indicates an electrical contact assembly in accordance with the invention. The assembly 10 includes a probe 12 which is selectively receivable within a housing 14. When the probe 12 is removed from the housing 14 it may be used in a conventional manner to test continuity or voltage in electrical circuits. However, when the probe 12 is received within the housing 14, the assembly 10 is suitable for maintaining electrical contact with an electrical cable or the like as described in more detail below.

The probe 12 is composite in nature and comprises an electrically conductive needle-like contact member 16 which is mounted to an inner component 20 which is slidingly received within the outer component 18. The inner component 20 includes an attachment protrusion 22 which extends through an aperture in a front face 28 of the outer component 18 for displacement as described in more detail below.

Biasing means in the form of a compression spring 24 is positioned over the attachment protrusion 22 and its one end abuts a front face 26 of the inner component 20, and its other end abuts the front face 28 of the outer component 18. In use, the inner component 20 is displaceable relative to the outer component 18 between a dormant position in which the inner component 20 is urged in the direction of arrow 30 and an operative position in which the inner component is urged in an opposite direction thereby to displace the contact member 16 forwardly relative to the outer component 18.

The inner component 20 is moulded from a synthetic plastics material which is preferably translucent or substantially transparent and includes a hollow chamber in which illumination means in the form of a light bulb 32 is replaceably located. An electrically conductive contact pin 33 extends through the attachment protrusion 22 and its lower end 34 makes electrical contact with the contact member 16 and its upper end defines a head 36 which makes contact with a terminal 38 of the light bulb 32 via a compression spring 40. Typically, the contact member 16 is attached to the contact pin 33 by means of releasable mounting means defined by an internal and external screw thread arrangement. Accordingly, in the event of the contact member 16 being damaged, it may be replaced.

A closure member in the form of an internally screw-threaded cap 42 is screwed onto an externally screw-threaded formation 44 of the inner component 20 thereby to retain the light bulb 32 within the hollow chamber. A length of flexible cord 46 is connected to releasable attachment means in the form of a crocodile clip 48 for making electrical connection with an earth line, typically an earth line in a motor vehicle. The flexible cord 46 is in electrical contact with a terminal 50 of the light bulb 32 via a contact member 35. The inner component 20 is rectangular in cross-sectional outline and is received with clearance within a complementary formation defined in the outer component 18. The outer component 18 is also rectangular in cross-sectional outline and is shaped to be received within a complemental socket 52 of the housing 14 with a friction fit.

The housing 14 includes an elongate nose portion 54 which terminates in a holding formation 56. The holding formation 56 is tapered (see FIGS. 2 and 3) and arranged to facilitate insertion thereof into a wiring harness.

The housing 14 includes two convex gripping formations 58, 60 (see FIGS. 1 and 3) which are shaped and dimensioned to facilitate gripping of the housing 14 by a user. The housing 14 is typically in the form of a unitary moulding of plastics material and the holding formation 56 defines a holding zone 62 (see FIGS. 2 and 3) for selectively holding an electrical cable 64 which typically forms part of a wiring harness. A terminal end of the holding zone 62 is defined by a convex abutment surface 66 against which the electrical cable 64 abuts in use. The abutment surface 66 is shaped to facilitate penetration of a needle-like end 68 of the contact member 16 through a plastics casing of sheath of the electrical cable 64 thereby to make electrical contact with a core of the cable 64.

The outer component 18 of the probe 12 is received within the socket 52 with a friction fit and abuts an abutment formation 70 (see FIG. 3) defined by the housing 14. When the probe 12 is received within the housing 14, relative displacement of the inner component 20 relative to the outer component 18 by exerting a longitudinal force in the direction of arrow 72 (see FIG. 3) on the cap 42 displaces the needle-like end 68 of the contact member 16 from a dormant position (as shown in solid lines in FIG. 3) to an operative position (as shown in broken lines in FIG. 3). In the dormant position, the needle-like end 68 is retracted within a body portion 74 of the housing 14 thereby to enable a user to position the cable 64 in the holding formation 62 in a hook-like fashion. In the operative position, the needle-like end 68 is displaced into the holding zone 62 to make electrical contact with the cable 64.

Figure 3:
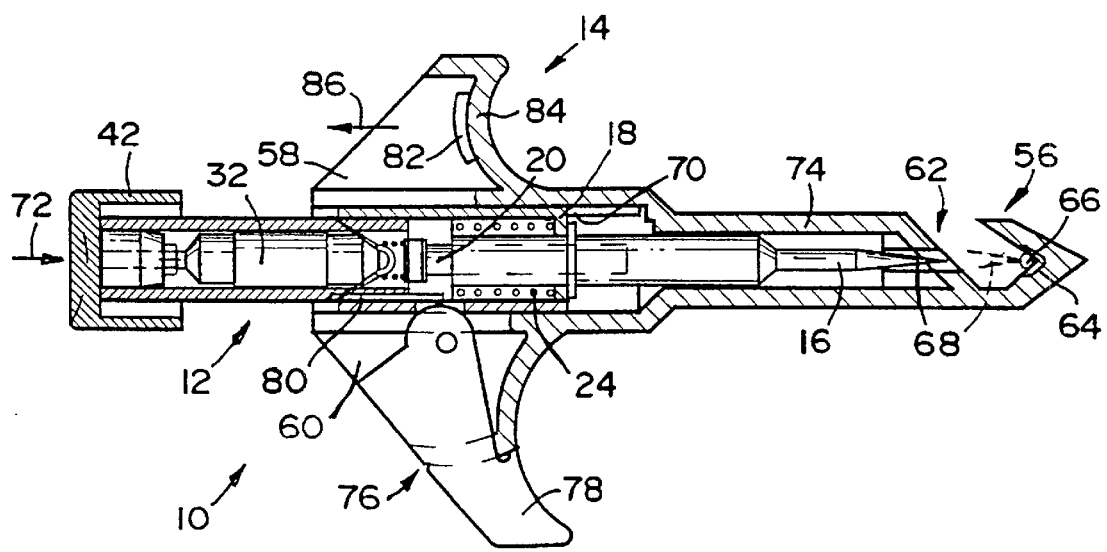
FIG. 3 shows a side view of the assembly of FIG. 1.

In order to retain the contact member 16 in its operative position, a locking arrangement 76 (see FIGS. 1 and 3) is provided. The locking formation 76 includes a locking lever 78 which is pivoted to the gripping formation 60. The locking lever 78 is pivoted between an operative position (as shown in FIG. 3) in which it frictionally engages a friction pad 80 (see FIG. 1) thereby to lock the inner component 20 in its forward position relative to the outer component 18 thereby to retain the needle-like end 68 in its operative position. Reflection means in the form of a convex metal mirror 82 is attached to an inner wall 84 of the gripping formation 58. In use, when the electrical contact assembly 10 is used, for example, to perform tests on electrical cables located beneath a dashboard of a vehicle, the mirror 82 may reflect light emitted by the light bulb 32 generally in the direction shown by arrow 86 thereby to facilitate detection thereof by a user. Further, recesses 88, 90 provided in the housing 14 and outer component 18 respectively to facilitate viewing of the light bulb 32 by a user.

Figure 2:
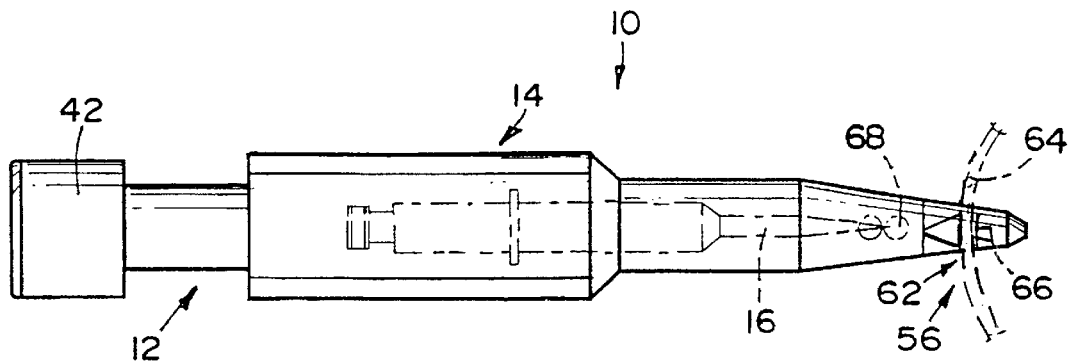
FIG. 2 shows a top plan view of the assembly of FIG. 1.

In use, the assembly 10 is typically used to test power on cables in a vehicle as mentioned above. The crocodile clip 48 is then connected to a negative line of the motor vehicle which, in turn, is connected to the light bulb 32 via the flexible cord 46. The probe 12 may be used as a stand-alone unit which may probe various points in an electrical circuit. In the event of the needle-like end 68 making contact with a positive supply line, the light bulb 32 is illuminated to provide an indication to a user. However, when it is desired fixedly to make contact with the electrical cable 64, the probe 12 is then inserted within the housing 14 and the cable 64 is captured by the holding formation 56 as shown in FIGS. 2 and 3. The needle-like end 68 may then be locked in its operative position in which it permanently makes contact with the electrical cable 64. Further, the capturing of the cable 64 by the assembly 10 is then facilitated by the shape of the holding formation 56.

The Applicant believes that the invention, as illustrated, provides a versatile electrical contact assembly 10 which may be used as a stand-alone probe 12 for testing electrical circuits, or the probe 12 may be removably inserted within the housing 14 thereby to enable the probe 12 to make permanent or continuous contact with the electrical cable 64.

I claim:

1. An electrical contact assembly, which includes
   an elongate probe having opposed fore and rear ends, the probe including
   a longitudinally arranged electrically conductive contact member having a pointed fore end which provides the fore end of the probe, and
   an externally exposed electrical connecting member electrically connected to the pointed fore end of the contact member;
   a housing including
   a body portion which is electrically non-conductive and which includes an elongate internal socket having opposed, open fore and rear ends, and
   a holding formation fast with the body portion and arranged to extend beyond the open fore end of the internal socket and transversely to hold an electrical cable in alignment with the open fore end of the internal socket, the probe being separate and apart from the housing and being replaceably receivable in the internal socket via the open rear end of the internal socket, the electrically conductive contact member being selectively movable relative to the internal socket between a dormant position of the probe in which the pointed fore end of the electrically conductive contact member is retracted within the internal socket and an operative position of the probe in which the pointed fore end projects from the internal socket toward the holding formation.

2. An electrical contact assembly as claimed in claim 1 in which the probe includes
   an outer hollow component which is replaceably, longitudinally, receivable in the internal socket;
   an inner component which is longitudinally movable along the outer component, the contact member being fast with the inner component, and the pointed fore end being forwardly extendable beyond the outer component, the electrical contact assembly including a locking arrangement arranged selectively to lock the inner component to the housing with the probe in the operative position and with the pointed fore end projecting from the internal socket toward the holding formation.

3. An electrical contact assembly as claimed in claim 2 in which the locking arrangement includes a finger operable lever pivoted on the housing, the lever including a finger operable force formation and a load formation arranged to act on the inner component when the lever is operated.

4. An electrical contact assembly as claimed in claim 3 in which the inner component includes a friction pad offered to the load formation for frictional abutment.

5. An electrical contact assembly as claimed in claim 3 in which the locking arrangement is arranged to lock the inner component selectively in the dormant position of the probe and in the operative position of the probe.

6. An electrical contact assembly as claimed in claim 2 in which the inner component is resiliently biased relative to the outer component to urge the pointed fore end rearwardly.

7. An electrical contact assembly as claimed in claim 2 in which the contact member is replaceable.

8. An electrical contact assembly as claimed in claim 1 in which the probe includes a replaceable light bulb electrically connected in series between the contact member and the externally exposed electrical connecting member.

9. An electrical contact assembly as claimed in claim 8 in which the light bulb is disposed within the inner component, the inner component being translucent.

10. An electrical contact assembly as claimed in claim 8 which includes a reflector arranged in use to reflect light rays from the light bulb to externally of the electrical contact assembly.

11. An electrical contact assembly as claimed in claim 1 in which the probe is replaceably frictionally receivable in the internal socket.

12. An electrical contact assembly as claimed in claim 2 in which the outer hollow component is frictionally receivable in the internal socket.

* * * * *